United States Patent
Eggers

(10) Patent No.: US 11,280,865 B2
(45) Date of Patent: Mar. 22, 2022

(54) DUAL RESOLUTION DIXON MAGNETIC RESONANCE IMAGING

(71) Applicant: KONINKLIJKE PHILIPS N.V., Eindhoven (NL)

(72) Inventor: Holger Eggers, Ellerhoop (DE)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 16/765,195

(22) PCT Filed: Jan. 9, 2019

(86) PCT No.: PCT/EP2019/050385
§ 371 (c)(1),
(2) Date: May 19, 2020

(87) PCT Pub. No.: WO2019/137932
PCT Pub. Date: Jul. 18, 2019

(65) Prior Publication Data
US 2020/0363486 A1 Nov. 19, 2020

(30) Foreign Application Priority Data
Jan. 11, 2018 (EP) .................................... 18151141

(51) Int. Cl.
*G01V 3/00* (2006.01)
*G01R 33/48* (2006.01)
(Continued)

(52) U.S. Cl.
CPC ....... *G01R 33/4828* (2013.01); *G01R 33/243* (2013.01); *G01R 33/3621* (2013.01); *G01R 33/543* (2013.01); *G01R 33/5608* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 4,871,967 A * 10/1989 Rotem ............... G01R 33/4828
324/309
5,771,893 A * 6/1998 Kassai ............... G01R 33/4806
324/306
(Continued)

FOREIGN PATENT DOCUMENTS

WO 2011080693 A1 7/2011

OTHER PUBLICATIONS

Ma et al "Breath Hold Water and Fat Imaging Using a Dual Echo Two Point Dixon Technique With an Efficient and Robust Phase-Correction Algorithm" Magnetic Resonance in Med. 52 p. 415-419 (2004).
(Continued)

Primary Examiner — Walter L Lindsay, Jr.
Assistant Examiner — Frederick Wenderoth

(57) ABSTRACT

The invention provides for a magnetic resonance imaging system (100). Machine executable instructions (140) cause a processor controlling the magnetic resonance imaging system to control (200) the magnetic resonance imaging system with the pulse sequence commands to acquire two point Dixon magnetic resonance data and single point Dixon magnetic resonance data; calculate (202) a first resolution magnetic field inhomogeneity map (148) using the two point Dixon magnetic resonance data; calculate (204) a second resolution magnetic field inhomogeneity map (154) by interpolating the first resolution magnetic inhomogeneity map to the second resolution; and calculate (206) a second resolution water image (156) and a second resolution fat image
(Continued)

(158) using the single point Dixon magnetic resonance imaging data and the second resolution magnetic field inhomogeneity map. The first resolution is lower than the second resolution.

15 Claims, 12 Drawing Sheets

(51) Int. Cl.
G01R 33/24 (2006.01)
G01R 33/36 (2006.01)
G01R 33/54 (2006.01)
G01R 33/56 (2006.01)

(58) Field of Classification Search
USPC .......................................................... 324/309
See application file for complete search history.

(56) References Cited

U.S. PATENT DOCUMENTS

| 7,486,074 | B2 | 2/2009 | McKenzie et al. |
| 8,854,038 | B2 | 10/2014 | Hernando et al. |
| 10,234,522 | B2 | 3/2019 | Eggers et al. |
| 2005/0033153 | A1* | 2/2005 | Moriguchi ........... G01R 33/565 600/410 |
| 2005/0165296 | A1* | 7/2005 | Ma .................. G01R 33/56563 600/410 |
| 2008/0278162 | A1* | 11/2008 | Bookwaiter ........... G01R 33/54 324/307 |
| 2016/0124064 | A1 | 5/2016 | De Weerdt et al. |
| 2017/0038446 | A1* | 2/2017 | Liu ........................ A61B 5/055 |

OTHER PUBLICATIONS

International Search Report From PCT/EP2019/050385 dated Apr. 9, 2019.

Yu et al "Single Acquisition Water-Fat Separation: Feasibility Study for Dynamic Imaging" Magnetic Resonance in Med. vol. 55, p. 413-422 (Dec. 21, 2005).

Junmin Liu et al: "Method of B0 mapping with magnitude-based correction for bipolar two-point Dixon cardiac MRI",Magnetic Resonance in Medicine.,vol. 78, No. 5,Dec. 8, 2016 (Dec. 8, 2016), pp. 1862-1869.

Mariya Doneva et al: "Compressed Sensing for Chemical Shift-Based Water-Fat Separation",Magnetic Resonance in Medicine, vol. 64 Sep. 21, 2010 (Sep. 21, 2010), pp. 1749-1759.

* cited by examiner

DUAL RESOLUTION DIXON MAGNETIC RESONANCE IMAGING

CROSS REFERENCE TO RELATED APPLICATIONS

This application is a U.S. national phase application of International Application No. PCT/EP2019/050385 filed on Jan. 9, 2019, which claims the benefit of EP Application Serial No. 18151141.1 filed on Jan. 11, 2018 and is incorporated herein by reference.

FIELD OF THE INVENTION

The invention relates to magnetic resonance imaging, in particular to Dixon magnetic resonance imaging

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by a transmitter coil cause perturbations to the local magnetic field, and RF signals emitted by the nuclear spins are detected by a receiver coil. These RF signals are used to construct the MRI images. These coils can also be referred to as antennas. Further, the transmitter and receiver coils can also be integrated into a single transceiver coil that performs both functions. It is understood that the use of the term transceiver coil also refers to systems where separate transmitter and receiver coils are used. The transmitted RF field is referred to as the B1 field.

MRI scanners are able to construct images of either slices or volumes. A slice is a thin volume that is only one voxel thick. A voxel is a small volume over which the MRI signal is averaged, and represents the resolution of the MRI image. A voxel may also be referred to as a pixel herein.

Dixon methods of magnetic resonance imaging include a family of techniques for producing separate water and lipid (fat) images. The various Dixon techniques such as, but not limited to, two-point Dixon methods, three-point Dixon methods, and six-point Dixon methods are collectively referred to herein as Dixon techniques or methods. The reconstruction of the water and fat images relies on the accurate determination of the phase error, largely due to B0 inhomogeneity, to prevent swapping of water and fat signals.

The journal article Yu et. al. "Single Acquisition Water-Fat Separation: Feasibility Study for Dynamic Imaging," Magnetic Resonance in Medicine 55:413-422 (2006) discloses a single echo Dixon method that assumes prior knowledge of B0 inhomogeneity.

SUMMARY OF THE INVENTION

The invention provides for a magnetic resonance imaging system, a computer program product, and a method in the independent claims. Embodiments are given in the dependent claims.

Gradient echo Dixon imaging is commonly associated with high sound pressure levels because of scan time, spatial resolution, echo time, and receiver bandwidth constraints. Embodiments may reduce the amount of acoustic noise generated by merging a lower resolution (first resolution) two point Dixon magnetic resonance imaging protocol with a higher resolution (second resolution) single point Dixon magnetic resonance imaging protocol. The two point Dixon magnetic resonance imaging protocol is used to determine a first resolution magnetic field inhomogeneity map. The first resolution magnetic field inhomogeneity map is then interpolated to the second resolution to create a second resolution magnetic field inhomogeneity map. The second resolution magnetic field inhomogeneity map then enables the use of a single point Dixon magnetic resonance imaging protocol.

In one aspect, the invention provides for a magnetic resonance imaging system comprising a memory for storing machine-executable instructions and pulse sequence commands. Pulse sequence commands as used herein encompass commands or data which can be converted into such commands which may be used to control a magnetic resonance imaging system to acquire magnetic resonance imaging data. For example pulse sequence commands may take the form of a timing chart which illustrates when the various actions are performed by various components of the magnetic resonance imaging system. The pulse sequence commands are configured to acquire two point Dixon magnetic resonance data according to a two point Dixon magnetic resonance imaging protocol from a region of interest. The pulse sequence commands are configured to acquire single point Dixon magnetic resonance data according to a single point Dixon magnetic resonance imaging protocol from the region of interest. The two point Dixon magnetic resonance imaging protocol is configured to sample the two point Dixon magnetic resonance data from a central k-space region.

The single point Dixon magnetic resonance imaging protocol is configuration to sample the single point Dixon magnetic resonance data from an expanded k-space region and the central k-space region. In some instances specific data points may belong to both the single point Dixon magnetic resonance data and the two point Dixon magnetic resonance data.

The expanded k-space region is larger than the central k-space region. The combination of the expanded k-space region and the central k-space region may be considered to be the complete k-space that is sampled. The expanded k-space region at least partially surrounds the central k-space region. The two point Dixon magnetic resonance imaging protocol is configured for generating images of the region of interest with a first resolution. The single point Dixon magnetic resonance imaging protocol is configured for generating images of the region of interest with a second resolution. The second resolution is higher than the first resolution.

The magnetic resonance imaging system further comprises a processor for controlling the magnetic resonance imaging system. Execution of the machine-executable instructions causes the processor to control the magnetic resonance imaging system with the pulse sequence commands to acquire the two point Dixon magnetic resonance data and the single point Dixon magnetic resonance data. Execution of the machine-executable instructions further causes the processor to calculate a first magnetic field inhomogeneity map using the two point Dixon magnetic resonance data. Execution of the machine-executable instructions further cause the processor to calculate a second magnetic field inhomogeneity map by interpolating the first resolution magnetic inhomogeneity map to the second resolution. Execution of the machine-executable instructions further cause the processor to calculate a second resolution water image and a second resolution fat image using the single point Dixon magnetic resonance data and the second resolution magnetic field inhomogeneity map.

This embodiment may be beneficial because acquiring the two point Dixon magnetic resonance data at a lower resolution may have the effect of reducing the amount of acoustic noise that occurs when the two point Dixon magnetic resonance data is acquired in comparison to acquiring the two point Dixon magnetic resonance data at the second resolution. An advantage of performing the two point Dixon magnetic resonance imaging protocol is that the magnetic field inhomogeneity map can be determined more reliably. So in this embodiment the two point Dixon magnetic resonance imaging protocol is performed at a lower resolution to lower the noise and to obtain a magnetic field inhomogeneity map at the first resolution. This is then interpolated and used as input for processing the single point Dixon magnetic resonance data. The use of the second magnetic field inhomogeneity map reduces the likelihood of voxels being incorrectly identified as containing predominantly water or fat.

In another embodiment, the pulse sequence commands are configured to sample the two point Dixon magnetic resonance data from a central k-space region using a bipolar dual-echo pulse sequence. The first echo is generated with a first readout gradient lobe with a first polarity and the second echo is generated with a second readout gradient lobe with a second polarity.

In another embodiment, the first readout gradient lobe has a first amplitude and a first duration. The second readout gradient lobe has a second amplitude and a second duration. The first duration times the first amplitude is less than the second duration times the second amplitude. This embodiment has the effect of making the first resolution less than the second resolution. This for example may be beneficial because it may reduce the amount of noise generated when the magnetic resonance data is acquired.

The terms "first readout gradient lobe" and "second readout gradient lobe" as used herein are labels for particular readout gradient lobes. The "first readout gradient lobe" may be performed before or after the "second readout gradient lobe" depending upon the implementation.

In another embodiment, the first amplitude and the second amplitude are the same, this may be beneficial because it may enable the minimization of the gradient amplitudes which may reduce the generation of acoustic noise.

In another embodiment, for example the first amplitude and the second amplitude are equal.

In another embodiment, the first amplitude is less than the second amplitude. This may be beneficial because it may reduce the amount of acoustic noise generated during the acquisition of the two point Dixon magnetic resonance data.

In another embodiment the first duration times the first amplitude times X is less than or equal to the second duration times the second amplitude, wherein X is number having any one of the values: 1.5, 2, 2.5, 3, 4, and 5.

In another embodiment, the first readout gradient lobe has a first amplitude and a first duration. The second readout gradient lobe has a second amplitude and a second duration. The first duration times the first amplitude times 2 equals the second duration times the second amplitude. The advantages of this embodiment have been discussed previously.

In another embodiment, the pulse sequence commands are further configured to sample the second echo asymmetrically. This again may have the benefit of reducing the amount of acoustic noise.

In another embodiment, the second resolution is twice as high as the first resolution in a readout direction and/or a phase encoding direction. This embodiment may be beneficial because it may reduce the amount of acoustic noise generated during the acquisition of the magnetic resonance data.

In another embodiment, the pulse sequence commands are further configured to sample the single point Dixon magnetic resonance data from the central k-space region and the expanded k-space region using the bipolar dual-echo pulse sequence. In this embodiment the bipolar dual-echo pulse sequence is used to acquire all of the magnetic resonance data. Again, this may have the benefit of reducing the amount of acoustic noise generated.

In another embodiment, the pulse sequence commands are configured to obtain the single point Dixon magnetic resonance data from the second echo of the bipolar dual-echo pulse sequence. For example the data acquired from both the first and second echo may be used for the two point Dixon magnetic resonance protocol and the data acquired from just the second echo may be used as input for the single point Dixon magnetic resonance imaging protocol.

In another embodiment, the pulse sequence commands are configured to partially sample the single point Dixon magnetic resonance data from the expanded k-space region using a unipolar single echo pulse sequence. The pulse sequence commands are further configured to sample the single point Dixon magnetic resonance data from the central k-space region and partially sample the expanded k-space region using the bipolar dual-echo pulse sequence. In this example a combination of a unipolar single echo pulse sequence and a dual-echo pulse sequence are used to acquire the magnetic resonance data. This may provide for more complete sampling of the k-space than using the bipolar dual-echo pulse sequence alone. This may provide for better image quality.

In another embodiment, the first readout gradient lobe has a first amplitude and a first duration. The second readout gradient lobe has a second amplitude and a second duration. The first duration times the first amplitude is less than the second duration times the second amplitude. This embodiment has the effect of making the first resolution less than the second resolution. This for example may be beneficial because it may reduce the amount of noise generated when the magnetic resonance data is acquired.

In another embodiment, the first amplitude and the second amplitude are the same, this may be beneficial because it may enable the minimization of the gradient amplitudes which may reduce the generation of acoustic noise.

In another embodiment, for example the first amplitude and the second amplitude could be the same. The value of the first amplitude can then be chosen to reduce noise.

In another embodiment, the first amplitude is less than the second amplitude. This may be beneficial because it may reduce the amount of acoustic noise generated during the acquisition of the two point Dixon magnetic resonance data.

In another embodiment the first duration times the first amplitude times X is less than or equal to the second duration times the second amplitude. Wherein X is number having any one of the values: 1.5, 2, 2.5, 3, 4, and 5.

In another embodiment, the first readout gradient lobe has a first amplitude and a first duration. The second readout gradient lobe has a second amplitude and a second duration. 2 times the first duration times the first amplitude equals the second duration x the second amplitude. The advantages of this embodiment have been discussed previously.

In another embodiment, the unipolar single echo pulse sequence has a third readout gradient lobe with a third amplitude and a third duration. The third duration times the third amplitude is greater than the second duration times the second amplitude. In this case the unipolar single echo pulse sequence is used to sample regions of k-space that have not been sampled by the bipolar dual-echo pulse sequence. When the bipolar dual-echo pulse sequence is used a portion of the expanded k-space region adjacent to the central k-space region is not sampled. This embodiment may be used to sample lines of k-space which are completely outside of the central k-space region. It provides for sampling the k-space at the same resolution for the single point Dixon protocol.

In another embodiment, the third amplitude is equal to or less than the second amplitude.

In another embodiment, the unipolar single echo pulse sequence has a third readout gradient lobe with a third amplitude and a third duration. The third duration times the third amplitude is equal to the second duration times the second amplitude times 1.5. In this case the unipolar single echo pulse sequence is used to sample regions of k-space that have not been sampled by the bipolar dual-echo pulse sequence. When the bipolar dual-echo pulse sequence is used a portion of the expanded k-space region adjacent to the central k-space region is not sampled. This embodiment may be used to sample lines of k-space which are completely outside of the central k-space region. It provides for sampling the k-space at the same resolution for the single point Dixon protocol.

In another embodiment, the third amplitude and the second amplitude are the same. This may be beneficial because the amplitude of the gradient pulses may be minimized which may reduce acoustic noise generation.

In another embodiment the bipolar dual-echo pulse sequences and the unipolar single echo pulse sequence have identical repetition times and flip angles. This embodiment may be beneficial because the use of the identical repetition times and flip angles means that the data acquired from the two pulse sequences can be combined and the contrast and other qualities of the image will be the same.

In another embodiment, the pulse sequence commands are configured to acquire the two point Dixon magnetic resonance imaging data and the single point Dixon magnetic resonance imaging data interleaved in time. For example a bipolar dual-echo pulse sequence could be used to sample only the central k-space region, and a unipolar single echo pulse sequence could be used to sample the complete k-space which includes both the expanded k-space region and the central k-space region. These two sequences could then be interleaved. In this case the bipolar dual-echo pulse sequence and the unipolar single echo pulse sequence may have identical repetition times and flip angles, however it is not strictly necessary.

In another embodiment, the calculation of the second resolution water image and the second resolution fat image is calculated at least partially using the two point Dixon magnetic resonance imaging data. In this way, the two point Dixon magnetic resonance imaging data is used not only to calculate the magnetic field inhomogeneity map, but also to improve the signal-to-noise ratio in the resulting water and fat images, for example.

In another aspect, the invention provides for a method of operating a magnetic resonance imaging system. The method comprises controlling the magnetic resonance imaging system with pulse sequence commands to acquire two point Dixon magnetic resonance data and single point Dixon magnetic resonance data. The pulse sequence commands are configured to acquire the two point Dixon magnetic resonance data according to a two point Dixon magnetic resonance imaging protocol from a region of interest. The pulse sequence commands are configured to acquire the single point Dixon magnetic resonance data according to a single point Dixon magnetic resonance imaging protocol from the region of interest. The two point Dixon magnetic resonance imaging protocol is configured to sample the two point Dixon magnetic resonance data from a central k-space region.

The single point Dixon magnetic resonance imaging protocol is configured to sample the single point Dixon magnetic resonance data from an expanded k-space region. The expanded k-space region is larger than the central k-space region. The expanded k-space region is at least partially surrounding the central k-space region. The two point Dixon magnetic resonance imaging protocol is configured for generating images of the region of interest with a first resolution. The single point Dixon magnetic resonance imaging protocol is configured for generating images of the region of interest with a second resolution. The second resolution is higher than the first resolution. The method further comprises calculating a first magnetic field inhomogeneity map using the two point Dixon magnetic resonance data. The method further comprises calculating a second magnetic field inhomogeneity map by interpolating the first resolution magnetic field inhomogeneity map to the second resolution. The method further comprises calculating a second resolution water image and a second resolution fat image using the single point Dixon magnetic resonance imaging data and the second resolution magnetic field inhomogeneity map. The advantages of this embodiment have been previously discussed.

In another aspect, the invention provides for a computer program product comprising machine-executable instructions for execution by a processor controlling the magnetic resonance imaging system. Execution of the machine-executable instructions causes the processor to control the magnetic resonance imaging system with pulse sequence commands to acquire the two point Dixon magnetic resonance data and single point Dixon magnetic resonance data. The pulse sequence commands are configured to acquire the two point Dixon magnetic resonance data according to a two point Dixon magnetic resonance imaging protocol from a region of interest. The pulse sequence commands are configured to acquire the single point Dixon magnetic resonance data according to a single point Dixon magnetic resonance imaging protocol from the region of interest.

The two point Dixon magnetic resonance imaging protocol is configured to sample the two point Dixon magnetic resonance data from a central k-space region. The single point Dixon magnetic resonance imaging protocol is configured to sample the single point Dixon magnetic resonance data from an expanded k-space region. The expanded k-space region is larger than the central k-space region. The expanded k-space region at least partially surrounds the central k-space region. The two point Dixon magnetic resonance imaging protocol is configured for generating images of the region of interest with a first resolution. The single point Dixon magnetic resonance imaging protocol is configured for generating images of the region of interest with a second resolution. The second resolution is higher than the first resolution.

Execution of the machine-executable instructions further causes the processor to calculate a first resolution magnetic field inhomogeneity map using the two point Dixon magnetic resonance data. Execution of the machine-executable instructions further causes the processor to calculate a second resolution magnetic field inhomogeneity map by interpolating the first resolution magnetic field inhomogeneity map to the second resolution. Execution of the machine-executable instructions further causes the processor to calculate a second resolution water image and a second resolution fat image using the single point Dixon magnetic resonance data and the second resolution magnetic field inhomogeneity map. The advantages of this embodiment have been previously discussed.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. A Magnetic Resonance Imaging (MRI) image or MR image is defined herein as being the reconstructed two or three dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
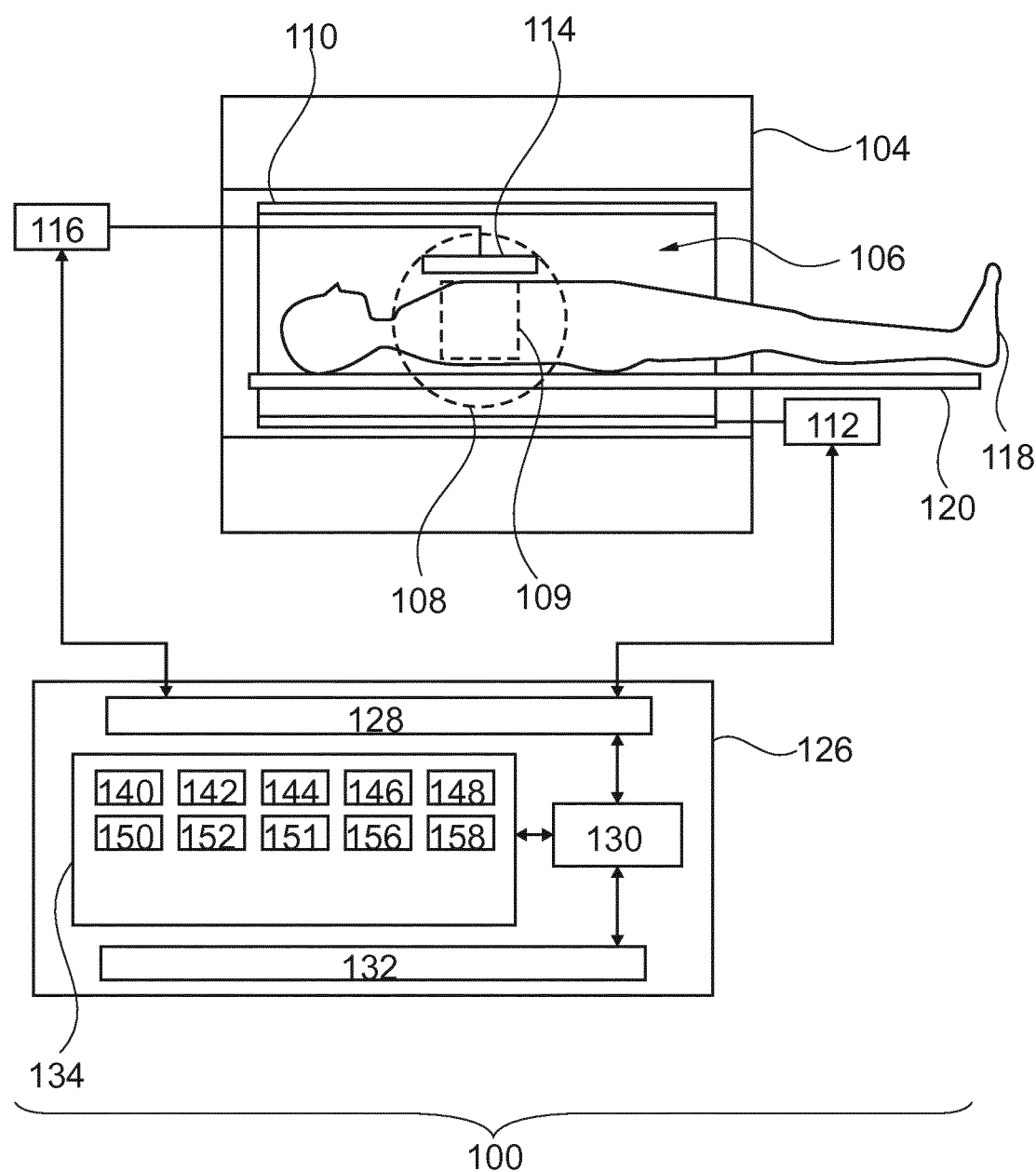
FIG. 1 illustrates an example of a magnetic resonance imaging system.

FIG. 1 shows an example of a magnetic resonance imaging system 100 with a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 106 of the cylindrical magnet 104 there is an imaging zone 108 where the magnetic field is strong and uniform enough to perform magnetic resonance imaging. A region of interest 109 is shown within the imaging zone 108. The magnetic resonance data is typically acquired for the region of interest. A subject 118 is shown as being supported by a subject support 120 such that at least a portion of the subject 118 is within the imaging zone 108 and the region of interest 109.

Within the bore 106 of the magnet there is also a set of magnetic field gradient coils 110 which is used for acquisition of magnetic resonance data to spatially encode magnetic spins within the imaging zone 108 of the magnet 104. The magnetic field gradient coils 110 are connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and separate receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

The transceiver 116 and the gradient controller 112 are shown as being connected to a hardware interface 128 of a computer system 126. The computer system further comprises a processor 130 that is in communication with the hardware system 128, a memory 134, and a user interface 132. The memory 134 may be any combination of memory which is accessible to the processor 130. This may include such things as main memory, cached memory, and also non-volatile memory such as flash RAM, hard drives, or other storage devices. In some examples the memory 134 may be considered to be a non-transitory computer-readable medium.

The memory 134 is shown as containing machine-executable instructions 140. The machine-executable instructions 140 enable the processor 130 to control the operation and function of the magnetic resonance imaging system 100. The machine-executable instructions 140 may also enable the processor 130 to perform various data analysis and calculation functions. The computer memory 134 is further shown as containing pulse sequence commands 142. The pulse sequence commands are configured for controlling the magnetic resonance imaging system 100 to acquire magnetic resonance data from the subject.

The computer memory 134 is further shown as containing two point Dixon magnetic resonance data 144 and single point Dixon magnetic resonance data 146 that was acquired from the region of interest 109 when the pulse sequence commands 142 were executed. The memory 134 is further shown as containing a first resolution magnetic field inhomogeneity map 148 that was calculated from the two point Dixon magnetic resonance data 144. The memory 134 is also shown as optionally containing a first resolution water image 150 and a first resolution fat image 152 that may also be calculated from the first resolution magnetic field inhomogeneity map 148.

The memory 134 is further shown as containing a second resolution magnetic field inhomogeneity map 154 that was created or calculated by interpolating the first resolution magnetic field inhomogeneity map 148 to the second resolution. The memory 134 is further shown as containing a second resolution water image 156 and a second resolution fat image 158 that were calculated using the single point Dixon magnetic resonance data 146 and the second resolution magnetic field inhomogeneity map 154. If the first resolution water image 150 and the first resolution fat image 152 are available they may also be used. For example the first resolution water image and the first resolution fat image could also be interpolated to the second resolution and used for a consistency check.

In some instances, there is some overlap or redundancy between the single point Dixon magnetic resonance data and the two point Dixon magnetic resonance data 144. For example, some of the two point Dixon magnetic resonance data 144 could be used as single point Dixon magnetic resonance data 146.

Figure 2:
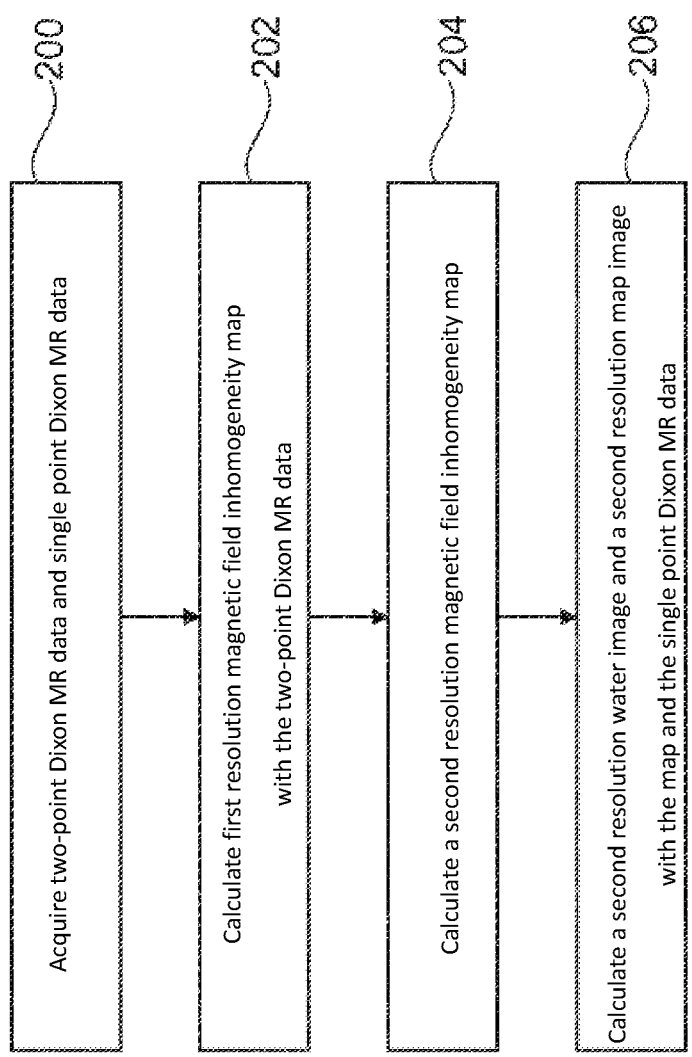
FIG. 2 shows a flow chart which illustrates a method of operating the magnetic resonance imaging system of claim 1.

FIG. 2 shows a flowchart which illustrates a method of operating the magnetic resonance imaging system 100 of FIG. 1. First in step 200 the magnetic resonance imaging system 100 is controlled with the pulse sequence commands 142 to acquire the two point Dixon magnetic resonance data 144 and the single point Dixon magnetic resonance data 146. The two point Dixon magnetic resonance data 144 was acquired at a first resolution. The single point Dixon magnetic resonance data 146 was acquired at a second resolution. The second resolution is higher than the first resolution. After step 200 step 202 is performed. In step 202 the first resolution magnetic field inhomogeneity map 148 is calculated using the two point Dixon magnetic resonance data 144.

Next in step 204 the second resolution magnetic field inhomogeneity map 154 is calculated by interpolating the first resolution magnetic field inhomogeneity map 148 to the second resolution. Finally in step 206 the second resolution water image 156 and the second resolution fat image 158 are calculated using the single point Dixon magnetic resonance imaging data 146 and the second resolution magnetic field inhomogeneity map 154. The method in FIG. 2 may have the effect of reducing acoustic noise during the acquisition of the magnetic resonance data. The single point Dixon magnetic resonance data may be acquired such that less acoustic noise occurs. However, a magnetic field inhomogeneity map is needed. The two point Dixon magnetic resonance data 144 is acquired at the first resolution which is lower. This has the effect of reducing the amount of acoustic noise. The combination of the acquisition of the two point Dixon magnetic resonance data 144 and the single point Dixon magnetic resonance data 146 enables accurate water and fat images to be obtained with a reduced amount of acoustic noise.

Figure 3:
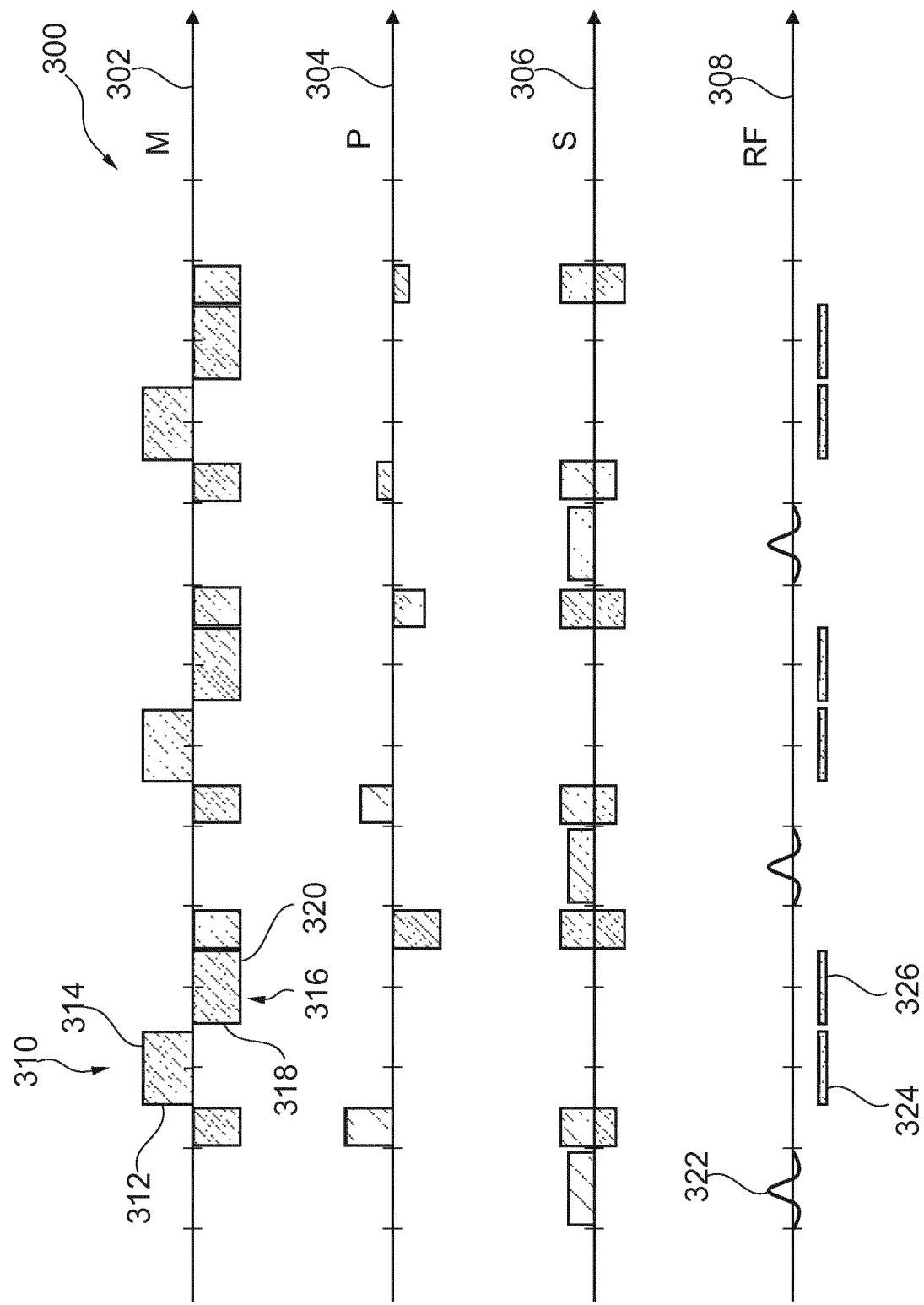
FIG. 3 illustrates an example of a pulse sequence.

Compared to standard gradient echo imaging, gradient echo Dixon imaging provides superior fat suppression and multiple contrasts simultaneously. It is commonly implemented with a dual-echo sequence, which generates two echoes after each excitation with a bipolar readout gradient. FIG. 3 shows a schematic (simplified) pulse sequence diagram of a 3D dual-gradient-echo Dixon sequence, covering three repetition times. It depicts a representation of a bipolar dual-echo pulse sequence 300, of which not all details are shown. The timeline illustrates the readout gradient 302, the phase encoding gradient 304, the slice selection gradient 306, and the radio-frequency transmission and reception 308.

The readout gradient 302 has a first readout gradient lobe 310 which has a first amplitude 312 and a first duration 314. It also has a second readout gradient lobe 316 which has a second amplitude 318 and a second duration 320. The second amplitude has an opposite polarity to the first amplitude. There is also an RF pulse 322 and then a first sampling 324 which corresponds to the first readout gradient lobe 310 and a second sampling 326 which corresponds to the second readout gradient lobe 316. The pulse sequence 300 depicted in FIG. 3 would be typically used to acquire magnetic resonance data for a two point Dixon magnetic resonance imaging protocol. The pulse sequence 300 could for example be adjusted to sample the two point Dixon magnetic resonance data at the second resolution. The k-space sampling pattern for the pulse sequence 300 in FIG. 3 is illustrated in FIG. 4 below.

Figure 4:
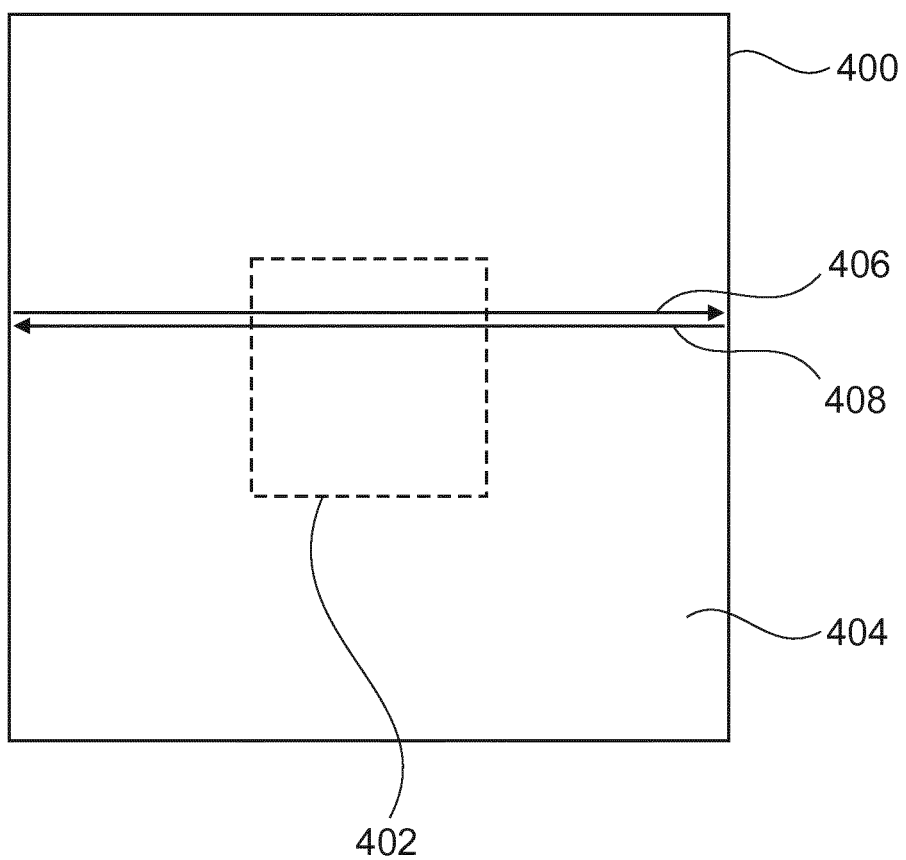
FIG. 4 shows an example of a sampling pattern in k-space.

FIG. 4 shows a large square 400 which is used to represent the k-space to be sampled by the pulse sequence 300 of FIG. 3. There is a smaller square 402 within the center of the sampled k-space 400. The square 402 represents the central k-space region. Between the squares 402 and 400 is an expanded k-space region 404. The expanded k-space region 404 at least partially surrounds the central k-space region 402. The line 406 indicates a first trajectory in k-space and the line 408 indicates a second trajectory in k-space. The line 406 corresponds to data acquired during the first sampling 324 and the line 408 corresponds to data acquired during the second sampling 326 of FIG. 3. During various repetitions, the trajectories 406 and 408 are moved vertically to sample the whole square 400. In this example the bipolar dual-echo pulse sequence 300 is used to sample the whole square. The use of such a sampling pattern may be disadvantageous because a large amount of acoustic noise may be generated.

Figure 5:
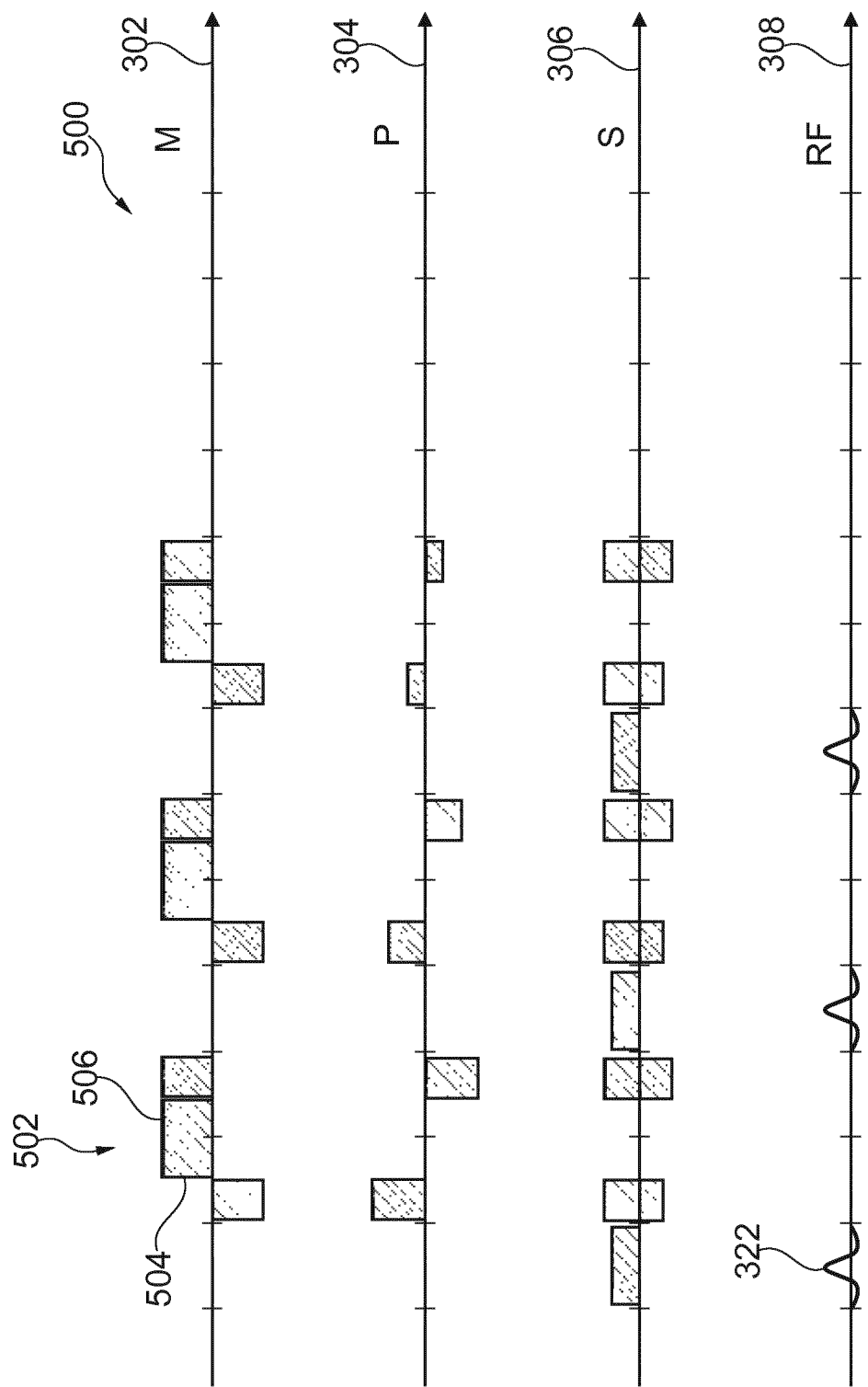
FIG. 5 illustrates a further example of a pulse sequence.

Alternatively, a single echo sequence may be used, which acquires only one echo after each excitation, as shown in FIG. 5 below. It allows reaching shorter repetition times at the expense of consistency of the fat suppression and signal-to-noise ratio. FIG. 5 below shows a schematic (simplified) pulse sequence diagram of a 3D single gradient-echo Dixon sequence, covering three repetition times. It depicts a representation of a unipolar single echo pulse sequence 500, which is similar to the pulse sequence 300 except in this case there is only a single readout gradient lobe 502. This single readout gradient lobe is referred to herein as the third readout gradient lobe. The term third readout gradient lobe is used as a label to distinguish it from the first and second readout gradient lobes of the bipolar dual-echo pulse sequence. The third readout gradient lobe 502 has a third amplitude 504 and a third duration 506. There is again an RF pulse 322 and there is a third sampling 508 which corresponds to the third readout gradient lobe 502.

FIG. 6 again shows the large square 400 which is this time used to represent the k-space to be sampled by the pulse sequence 500 of FIG. 5. The line 600 indicates a trajectory in k-space, which corresponds to data acquired during the sampling 508. The unipolar single echo pulse sequence 500 in FIG. 5 could be used to sample the whole square.

Gradient echo Dixon imaging is usually associated with high sound pressure levels because of
scan time constraints, for example in abdominal imaging with breath-holding,
spatial resolution requirements,
echo time restrictions, to achieve a robust and, in terms of signal-to-noise ratio, efficient water-fat separation, and
receiver bandwidth constraints, to limit distortions due to chemical shift and main field inhomogeneity.

Dual-echo sequences require an additional inversion of the readout gradient, which contributes to acoustic noise. Single-echo sequences complicate an accurate water-fat separation, because of fundamental difficulties in estimating the spatial variation of the main field reliably.

Examples may merge low-resolution dual-echo and high-resolution single-echo sequences to reduce acoustic noise in gradient echo Dixon imaging while meeting the mentioned constraints.

Two examples are described in more detail below. The first embodiment, illustrated in FIGS. 7 and 9 below, combines a dual-echo sequence with reduced spatial resolution and a single-echo sequence with full spatial resolution. The spatial resolution is halved in the readout and the phase encoding directions for the dual-echo sequence to decrease the gradient amplitudes and thus the sound pressure level. For the same reason, and to preserve contrast, the repetition time and the flip angle are kept the same for the single-echo sequence. The water and fat signals are close to opposed-phase and in-phase at the echo times for the dual-echo sequence, and close to in quadrature at the echo time for the single-echo sequence. In this way, a favorable noise propagation in the water-fat separation is achieved.

Figure 7:
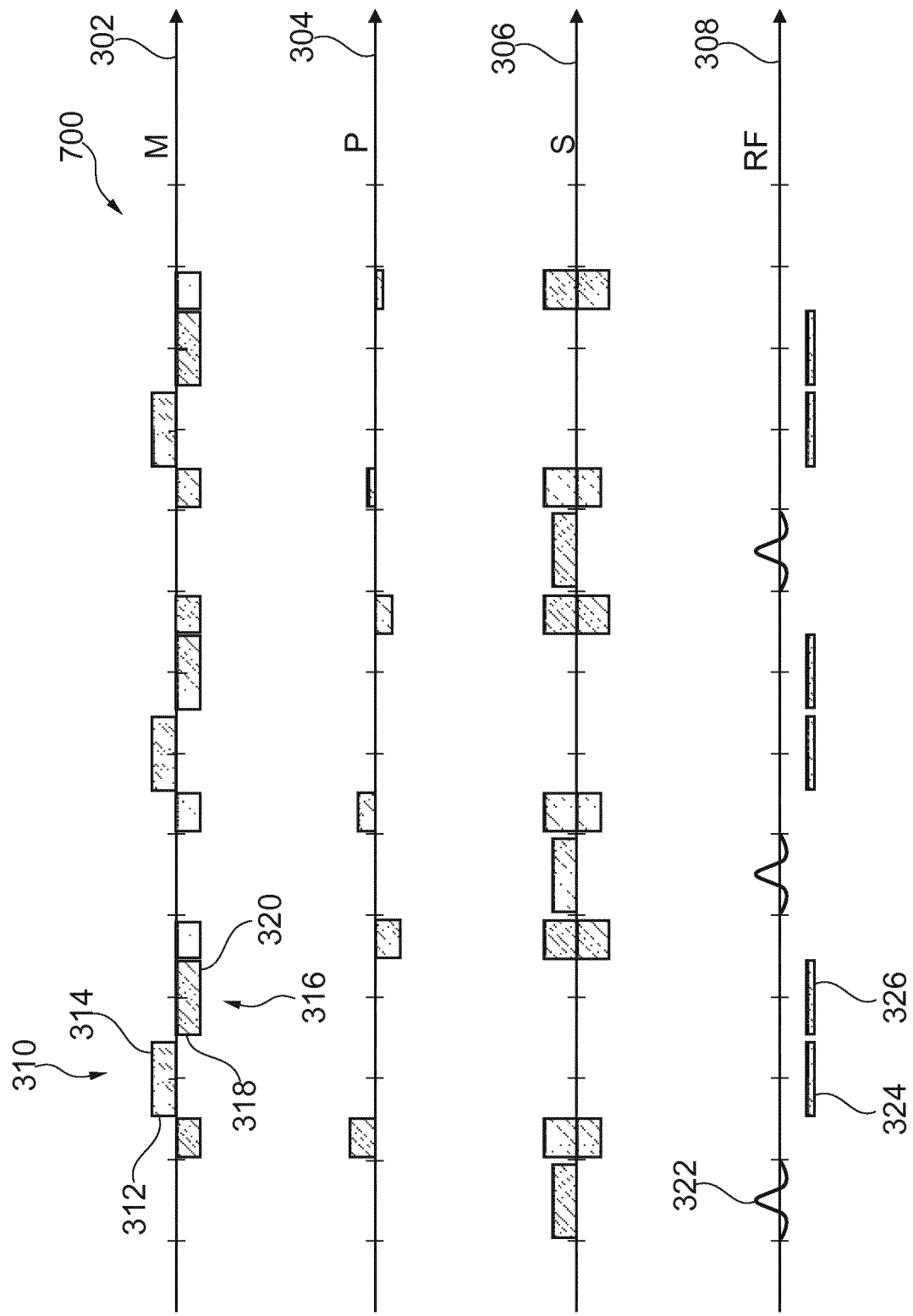
FIG. 7 illustrates a further example of a pulse sequence.

FIG. 7 shows a modified bipolar dual-echo pulse sequence 700. The pulse sequence 700 is similar to the pulse sequence 300 depicted in FIG. 3. However, the first amplitude 312 has been reduced by a factor of 2 and the second amplitude 318 has also been reduced by a factor of 2. The amplitudes of further gradient lobes for phase encoding 304 have been reduced by a factor of 2 also. This has the effect of reducing the resolution in the readout and the phase encoding directions by a factor of 2. This also has the effect of reducing the amount of acoustic noise generated when the pulse sequence 700 is executed.

FIG. 8 again shows the sampled k-space 400. In this instance the line 406 indicates a trajectory in k-space, which corresponds to data acquired during the sampling 324 in FIG. 7, and the line 408 indicates a trajectory in k-space, which corresponds to data acquired during the sampling 326 in FIG. 7. It can be seen that k-space is sampled only within the central k-space region 402.

One way of reducing acoustic noise would be to first sample the central k-space region 402 using the pulse sequence 700. The first magnetic field inhomogeneity map could then be calculated. The single point Dixon magnetic resonance data could then be acquired using the pulse sequence 500 and trajectories in k-space similar to the one in FIG. 6. When calculating the second resolution water image and the second resolution fat image the first magnetic field inhomogeneity map could be used as was previously discussed. The pulse sequence 500 of FIG. 5 and the pulse sequence 700 of FIG. 7 could also be interleaved. The pulse sequences 500 in FIG. 5 and 700 in FIG. 7 could be adjusted so that they have identical repetition times and flip angles.

Figure 6:
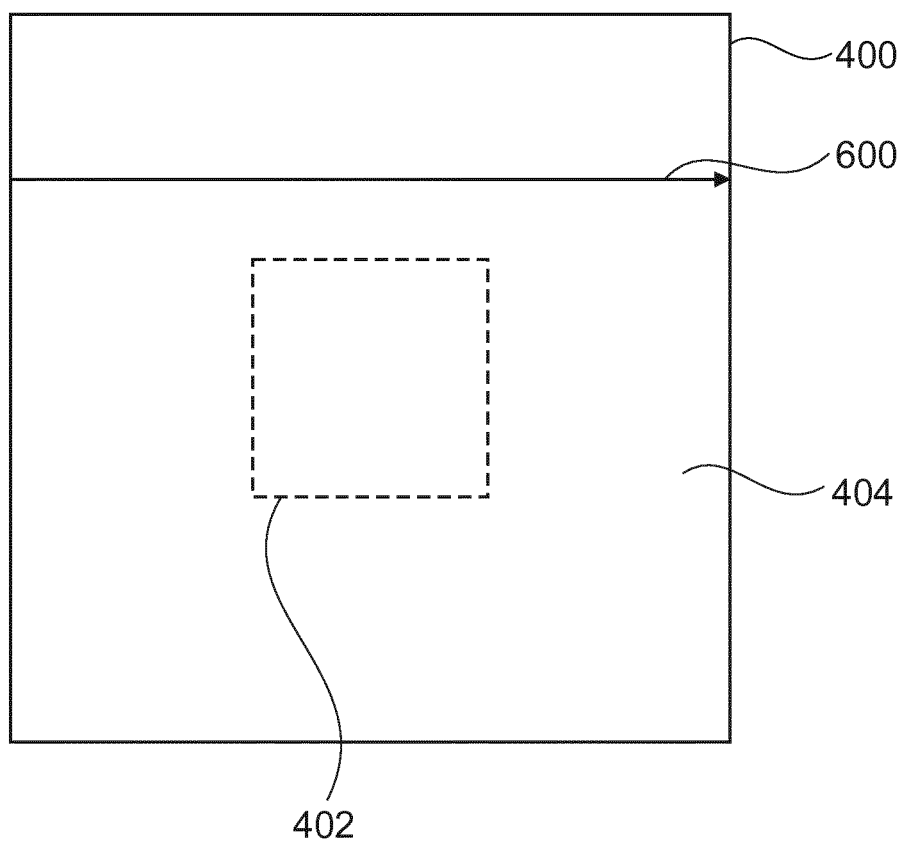
FIG. 6 shows a further example of a sampling pattern in k-space.
Figure 9:
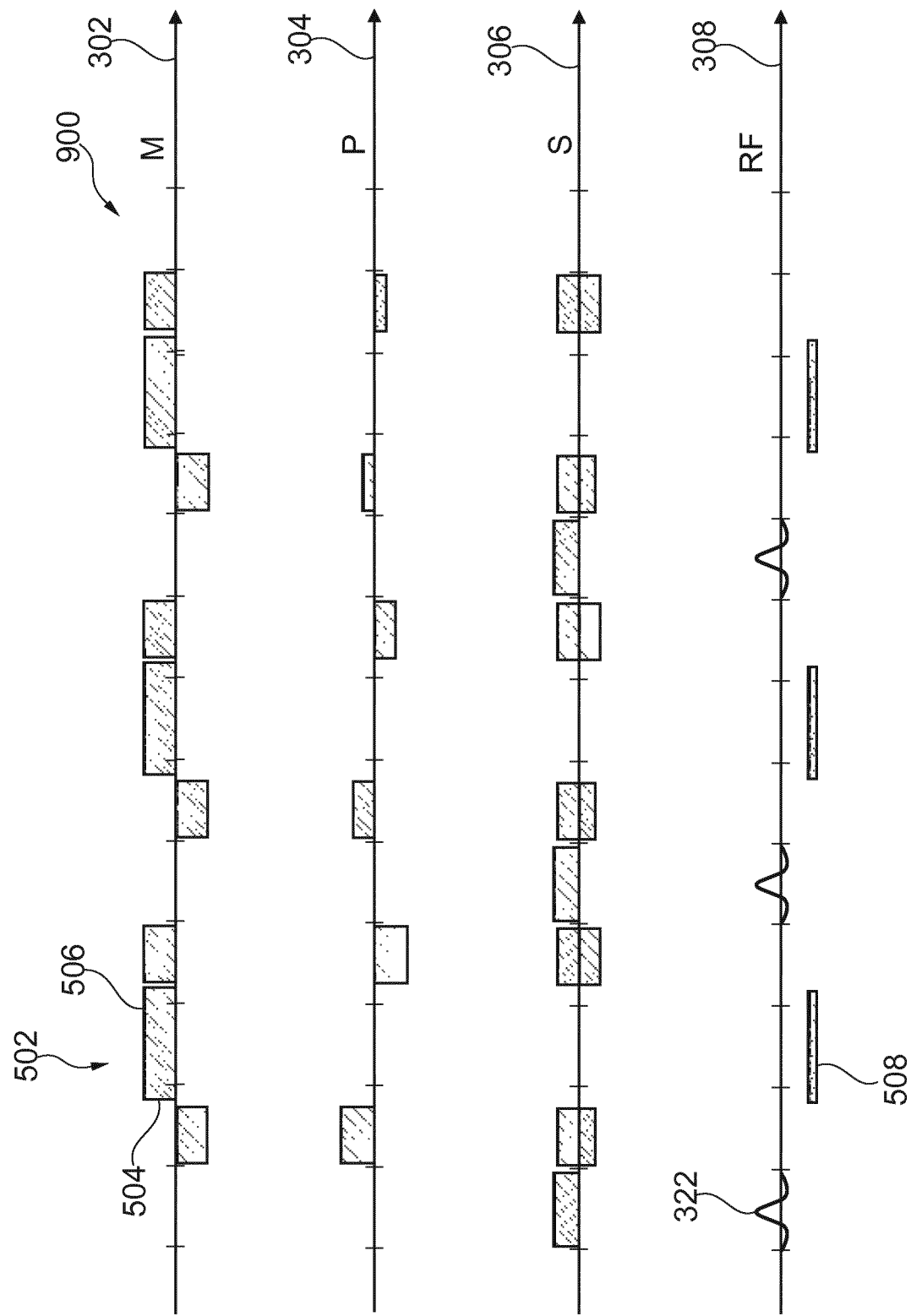
FIG. 9 illustrates a further example of a pulse sequence.

FIG. 9 shows a further example of a unipolar single echo pulse sequence 900. The pulse sequence 900 is a modification of the pulse sequence 500 of FIG. 5. It now has the same repetition time as the pulse sequence 700 in FIG. 7. The pulse sequences 700 of FIG. 7 and 900 of FIG. 9 can then be interleaved easily, with the pulse sequence 700 sampling along the trajectories in k-space 406 and 408 as illustrated in FIG. 9 and the pulse sequence 900 sampling along the trajectories in k-space 600 as depicted in FIG. 6.

The scan time for the hybrid dual-/single-echo sequence of FIGS. 7 and 9 is about 50% longer than the scan time for the dual-echo sequence of FIG. 3. However, it may be decreased by reducing the spatial resolution also in the slice encoding direction or further in the phase encoding direction. Moreover, the repeated acquisition of the central k-space may be exploited to improve the signal-to-noise ratio. Alternatively, any repeated acquisition may be avoided by reducing the spatial resolution only in the phase encoding or slice selection direction.

If the dual-echo and single-echo sequences are interleaved in time, the repetition time and the flip angle may also be varied between the two sequences to decrease the sound pressure level further at the expense of contrast.

The second embodiment, illustrated in FIG. 10 below, combines a low-resolution full-echo acquisition with a high-resolution partial-echo acquisition. The spatial resolution is halved in the readout direction for the first echo to decrease the gradient amplitude or the echo time. For the same reason, only three-fourths of the second echo are sampled.

In general, low-resolution or partial echo acquisitions facilitate obtaining favorable echo times in gradient echo Dixon imaging, especially when lower readout gradient strengths are employed to reduce acoustic noise.

Figure 10:
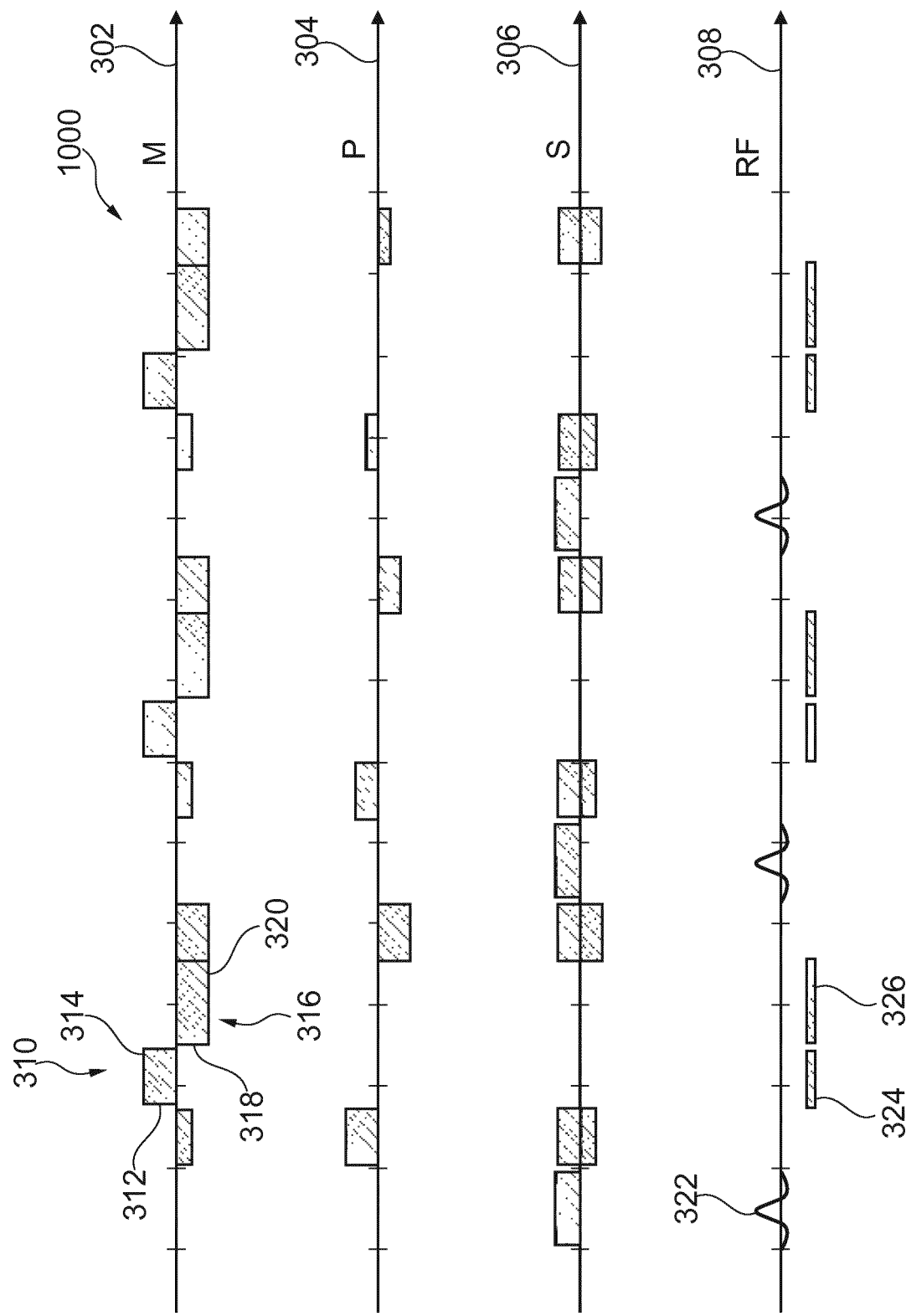
FIG. 10 illustrates a further example of a pulse sequence.

FIG. 10 illustrates a further example of a bipolar dual-echo pulse sequence 1000. The pulse sequence 1000 of FIG. 10 is similar to the pulse sequence 700 of FIG. 7 except the second duration 320 is now longer than the first duration 314. This has the effect of asymmetrically sampling k-space. The same effect could also be achieved by adjusting the amplitudes 312 and 318 relative to each other or a combination of adjusting the durations and the amplitudes. However, to reduce the amount of acoustic noise it may be beneficial to reduce the amplitudes of both and just to make one duration longer than the other.

Figure 8:
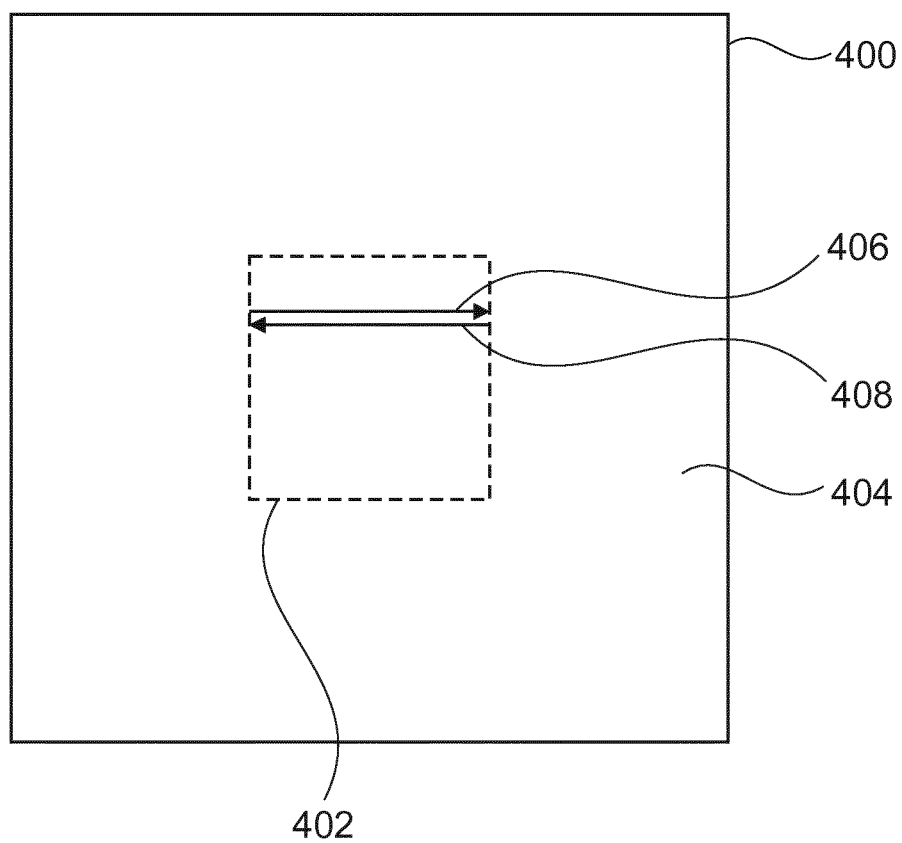
FIG. 8 shows a further example of a sampling pattern in k-space.
Figure 11:
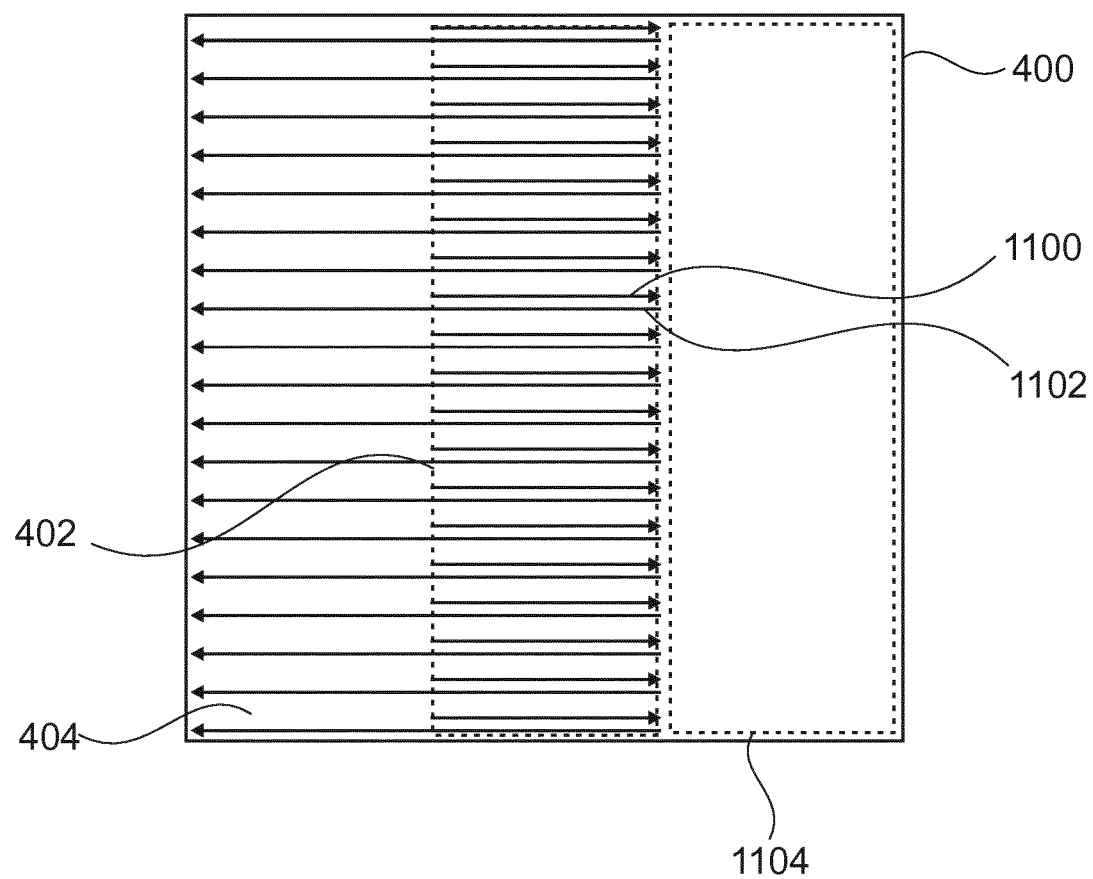
FIG. 11 shows a further example of a sampling pattern in k-space.

FIG. 11 illustrates the effect on the trajectory in k-space. The complete sampled k-space 400 is again shown. The line marked 1100 corresponds to data acquired during the sampling 324 of FIG. 10 and the line marked 1102 corresponds to data acquired during the sampling 326 of FIG. 10. The data sampled along the trajectory 1100 and part of the data sampled along the trajectory 1102 can be the two point Dixon magnetic resonance data. For example the data sampled along the trajectory 1102 outside of the central k-space region 402 can be ignored. All data sampled along the trajectory 1102 can be the single point Dixon magnetic resonance data. The use of the pulse sequence 1000 in FIG. 10 would then enable the simultaneous acquisition of both the two point Dixon magnetic resonance data and the single point Dixon magnetic resonance data. The k-space region to the right 1104 remains unsampled in this case. In FIG. 11, the central k-space region 402 has been expanded vertically so that all of the two point Dixon magnetic resonance data acquired is used for the calculation of the first resolution magnetic field inhomogeneity map. In other examples, the central k-space region 402 may be the same size as is illustrated in FIG. 8.

In FIG. 11, because the "first readout gradient lobe" may be performed before or after the "second readout gradient lobe" depending upon the implementation the order in which the readout of lines 1100 and 1102 may be reversed. The directions of the arrows 1100 and 1102 may therefore be reversed in some examples.

Figure 12:
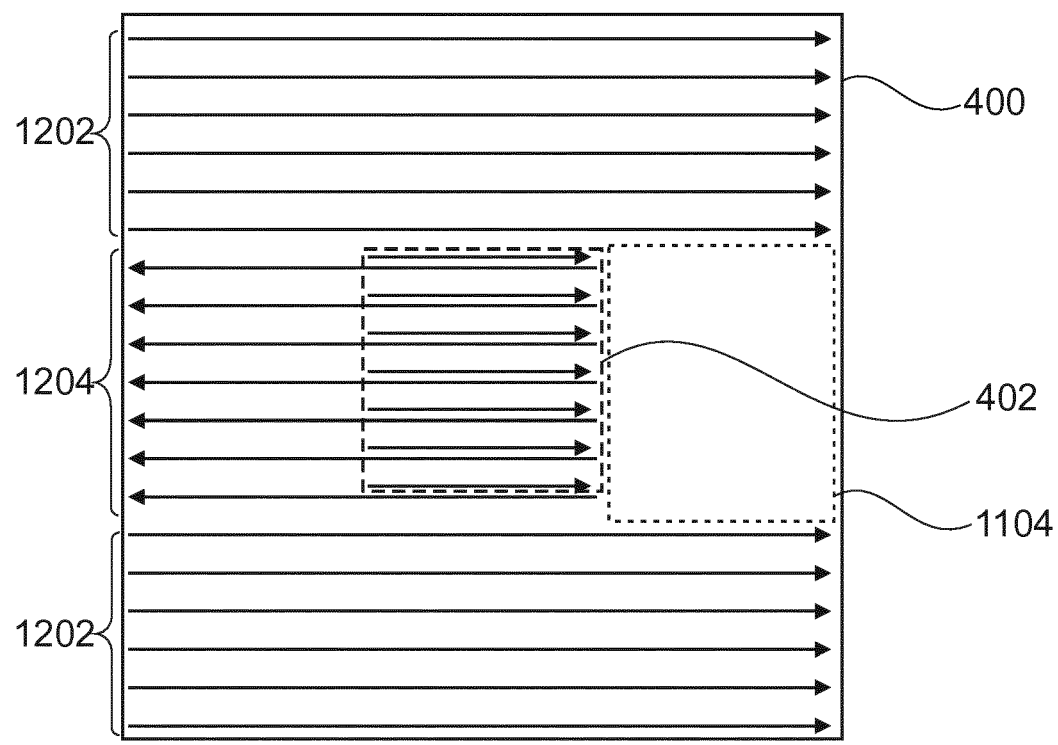
FIG. 12 shows a further example of a sampling pattern in k-space.

The pulse sequence 900 of FIG. 9 can be modified so that it has the same repetion time as the pulse sequence 1000 in FIG. 10. FIG. 12 illustrates how the pulse sequence 1000 of FIG. 10 and how the modified pulse sequence 900 of FIG. 9 can be combined. The k-space regions labeled 1202 are regions which are sampled using the modified pulse sequence 900. The region labeled 1204 is a k-space region which is sampled using the pulse sequence 1000. It can be seen that the unsampled region 1104 in FIG. 12 is smaller than the unsampled region 1104 in FIG. 11. To sample the k-space as illustrated in FIG. 12 the pulse sequence 1000 of FIG. 10 and the modified pulse sequence 900 of FIG. 9 could also be interleaved.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 magnetic resonance imaging system
104 magnet
106 bore of magnet
108 imaging zone
109 region of interest
110 magnetic field gradient coils
112 magnetic field gradient coil power supply
114 radio-frequency coil
116 transceiver
118 subject
120 subject support
126 computer system
128 hardware interface
130 processor
132 user interface
134 computer memory
140 machine executable instructions
142 pulse sequence commands
144 two point Dixon magnetic resonance data
146 single point Dixon magnetic resonance data
148 first resolution magentic field inhomogenity map
150 first resolution water image
152 first resolution fat image
154 second resolution magnetic field inhomogenity map
156 second resolution water image
158 second resolution fat image
200 control the magnetic resonance imaging system with the pulse sequence commands to acquire the two point Dixon magnetic resonance data and the single point Dixon magnetic resonance data
202 calculate a first resolution magnetic field inhomogeneity map using the two point Dixon magnetic resonance data 204 calculate a second resolution magnetic field inhomogeneity map by interpolating the first resolution magnetic inhomogeneity map to the second resolution
206 calculate a second resolution water image and a second resolution fat image using the single point Dixon magnetic resonance imaging data and the second resolution magnetic field inhomogeneity map
300 bipolar dual-echo pulse sequence
302 readout gradient
304 phase encoding gradient
306 slice selection gradient
308 radio frequency transmission and reception
310 first readout gradient lobe
312 first amplidute
314 first duration
316 second readout gradient lobe
318 second amplitude
320 second duration
322 RF pulse
324 first sampling
326 second sampling
400 sampled k-space
402 central k-space region
404 expanded k-space region
406 magnetic resonance data sampled during 324
408 magnetic resonance data sampled during 326
500 unipolar single echo pulse sequence
502 third readout gradient lobe
504 third amplitude
506 third duration
508 third sampling
600 magnetic resonance data sampled during 508
700 bipolar dual-echo pulse sequence
900 unipolar single echo pulse sequence
1000 bipolar dual-echo pulse sequence
1100 magnetic resonance data sampled during 324
1102 magnetic resonance data sampled during 326
1104 unsampled region
1200 magnetic resonance data sampled during 508
1202 k-space region where modified pulse sequence 900 is applied
1204 k-space region where pulse sequence 1000 is applied

The invention claimed is:

1. A magnetic resonance imaging system, comprising:
a memory for storing machine executable instructions and pulse sequence commands, wherein the pulse sequence commands are configured to:
acquire two point Dixon magnetic resonance data according to a two point Dixon magnetic resonance imaging protocol from a region of interest, wherein the two point Dixon magnetic resonance imaging protocol is configured to sample the two point Dixon magnetic resonance data from a central k-space region, wherein the two point Dixon magnetic resonance imaging protocol is configured for acquiring images of the region of interest with a first resolution and
acquire single point Dixon magnetic resonance data according to a single point Dixon magnetic resonance imaging protocol from the region of interest, wherein the single point Dixon magnetic resonance imaging protocol is configured to sample the single point Dixon magnetic resonance data from an expanded k-space region and the central k-space region, wherein the expanded k-space region is larger than the central k-space region, wherein the expanded k-space region at least partially surrounds the central k-space region, wherein the single point Dixon magnetic resonance imaging protocol is configured for acquiring images of the region of interest with a second resolution that is higher than the first resolution; and
a processor for controlling the magnetic resonance imaging system, wherein execution of the machine executable instructions cause the processor to:
control the magnetic resonance imaging system with the pulse sequence commands to acquire the two point Dixon magnetic resonance data and the single point Dixon magnetic resonance data;
calculate a first resolution magnetic field inhomogeneity map at the first resolution using the two point Dixon magnetic resonance data;
calculate a second resolution magnetic field inhomogeneity map by interpolating the first resolution magnetic inhomogeneity map to the second resolution; and
calculate a second resolution water image at the second resolution and a second resolution fat image at the second resolution using the single point Dixon magnetic resonance imaging data and the second resolution magnetic field inhomogeneity map.

2. A method of operating a magnetic resonance imaging system, wherein the method comprises:
controlling the magnetic resonance imaging system with pulse sequence commands to acquire two point Dixon magnetic resonance data and single point Dixon magnetic resonance data, wherein the pulse sequence commands are configured to acquire the two point Dixon magnetic resonance data according to a two point Dixon magnetic resonance imaging protocol from a region of interest, wherein the pulse sequence commands are configured to acquire the single point Dixon magnetic resonance data according to a single point Dixon magnetic resonance imaging protocol from the region of interest, wherein the two point Dixon magnetic resonance imaging protocol is configured to sample the two point Dixon magnetic resonance data from a central k-space region, wherein the single point Dixon magnetic resonance imaging protocol is configured to sample the single point Dixon magnetic resonance data from an expanded k-space region and the central k-space region, wherein the expanded k-space region is larger than the central k-space region, wherein the expanded k-space region at least partially surrounds the central k-space region, wherein the two point Dixon magnetic resonance imaging protocol is configured for acquiring images of the region of interest with a first resolution, wherein the single point Dixon magnetic resonance imaging protocol is configured for acquiring images of the region of interest with a second resolution, wherein the second resolution is higher than the first resolution;
calculating a first resolution magnetic field inhomogeneity map at the first resolution using the two point Dixon magnetic resonance data;
calculating a second resolution magnetic field inhomogeneity map by interpolating the first resolution magnetic inhomogeneity map to the second resolution; and
calculating a second resolution water image at the second resolution and a second resolution fat image at the second resolution using the single point Dixon magnetic resonance imaging data and the second resolution magnetic field inhomogeneity map.

3. A computer program product comprising machine executable instructions stored on a non-transitory computer readable medium for execution by a processor that controls a magnetic resonance imaging system, wherein execution of the machine executable instructions cause the processor to:

control the magnetic resonance imaging system with pulse sequence commands to acquire two point Dixon magnetic resonance data and single point Dixon magnetic resonance data, wherein the pulse sequence commands are configured to acquire the two point Dixon magnetic resonance data according to a two point Dixon magnetic resonance imaging protocol from a region of interest, wherein the pulse sequence commands are configured to acquire the single point Dixon magnetic resonance data according to a single point Dixon magnetic resonance imaging protocol from the region of interest, wherein the two point Dixon magnetic resonance imaging protocol is configured to sample the two point Dixon magnetic resonance data from a central k-space region, wherein the single point Dixon magnetic resonance imaging protocol is configured to sample the single point Dixon magnetic resonance data from an expanded k-space region and the central k-space region, wherein the expanded k-space region is larger than the central k-space region, wherein the expanded k-space region at least partially surrounds the central k-space region, wherein the two point Dixon magnetic resonance imaging protocol is configured for acquiring images of the region of interest with a first resolution, wherein the single point Dixon magnetic resonance imaging protocol is configured for acquiring images of the region of interest with a second resolution, wherein the second resolution is higher than the first resolution;

calculate a first resolution magnetic field inhomogeneity map at the first resolution using the two point Dixon magnetic resonance data;

calculate a second resolution magnetic field inhomogeneity map by interpolating the first resolution magnetic inhomogeneity map to the second resolution; and calculate a second resolution water image at the second resolution and a second resolution fat image at the second resolution using the single point Dixon magnetic resonance imaging data and the second resolution magnetic field inhomogeneity map;

wherein the pulse sequence commands are configured to sample the two point Dixon magnetic resonance data from a central k-space region using a bipolar dual-echo pulse sequence, wherein the first echo is generated with a first readout gradient lobe with a first polarity and the second echo is generated with a second readout gradient lobe with a second polarity;

wherein the pulse sequence commands are configured to partially sample the single point Dixon magnetic resonance data from the expanded k-space region using a unipolar single echo pulse sequence, wherein the pulse sequence commands are further configured to sample the single point Dixon magnetic resonance data from the central k-space region and partially sample the single point Dixon magnetic resonance data from the expanded k-space region using the bipolar dual-echo pulse sequence.

4. The magnetic resonance imaging system of claim 1, wherein the pulse sequence commands are configured to sample the two point Dixon magnetic resonance data from a central k-space region using a bipolar dual-echo pulse sequence, wherein the first echo is generated with a first readout gradient lobe with a first polarity and the second echo is generated with a second readout gradient lobe with a second polarity.

5. The magnetic resonance imaging system of claim 4, wherein the first readout gradient lobe has a first amplitude and a first duration, wherein the second readout gradient lobe has a second amplitude and a second duration, and wherein the first duration times the first amplitude is less than the second duration times the second amplitude.

6. The magnetic resonance imaging system of claim 5, wherein the pulse sequence commands are further configured to sample the second echo asymmetrically.

7. The magnetic resonance imaging system of claim 4, wherein the second resolution is twice as high as the first resolution in a readout direction and/or a phase encoding direction.

8. The magnetic resonance imaging system of claim 4, wherein the pulse sequence commands are further configured to sample the single point Dixon magnetic resonance data from the central k-space region and the expanded k-space region using the bipolar dual-echo pulse sequence.

9. The magnetic resonance imaging system of claim 8, wherein the pulse sequence commands are configured to obtain the single point Dixon magnetic resonance data from the second echo of the bipolar dual-echo pulse sequence.

10. The magnetic resonance imaging system of claim 4, wherein the pulse sequence commands are configured to partially sample the single point Dixon magnetic resonance data from the expanded k-space region using a unipolar single echo pulse sequence, wherein the pulse sequence commands are further configured to sample the single point Dixon magnetic resonance data from the central k-space region and partially sample the single point Dixon magnetic resonance data from the expanded k-space region using the bipolar dual-echo pulse sequence.

11. The magnetic resonance imaging system of claim 10, wherein the first readout gradient lobe has a first amplitude and a first duration, wherein the second readout gradient lobe has a second amplitude and a second duration, wherein the first duration times the first amplitude is less than the second duration times the second amplitude.

12. The magnetic resonance imaging system of claim 11, wherein the unipolar single echo pulse sequence has a third readout gradient lobe with a third amplitude and a third duration (506), wherein the third duration times the third amplitude is greater than the second duration times the second amplitude.

13. The magnetic resonance imaging system of claim 10, wherein the bipolar dual-echo pulse sequence and the unipolar single echo pulse sequence have identical repetition times and flip angles.

14. The magnetic resonance imaging system of claim 1, wherein the pulse sequence commands are configured to acquire the two point Dixon magnetic resonance imaging data and the single point Dixon magnetic resonance data interleaved in time.

15. The magnetic resonance imaging system of claim 1, where the calculation of the second resolution water image and the second resolution fat image is calculated at least partially using the two point Dixon magnetic resonance imaging data.

* * * * *